United States Patent
Furuichi et al.

(10) Patent No.: US 8,015,370 B2
(45) Date of Patent: Sep. 6, 2011

(54) MEMORY CONTROL METHOD AND MEMORY SYSTEM

(75) Inventors: Tetsuo Furuichi, Osaka (JP); Yasuhisa Marumo, Osaka (JP)

(73) Assignee: MegaChips Corporation, Osaka-shi (JP)

( * ) Notice: Subject to any disclaimer, the term of this patent is extended or adjusted under 35 U.S.C. 154(b) by 552 days.

(21) Appl. No.: 12/025,321

(22) Filed: Feb. 4, 2008

(65) Prior Publication Data

US 2008/0201538 A1 Aug. 21, 2008

(30) Foreign Application Priority Data

Feb. 19, 2007 (JP) ................................. 2007-037772

(51) Int. Cl.
*G06F 12/00* (2006.01)
*G06F 13/00* (2006.01)
*G06F 13/28* (2006.01)

(52) U.S. Cl. ......................... 711/154; 711/103; 711/170

(58) Field of Classification Search .................. 711/103, 711/154, 170–173
See application file for complete search history.

(56) References Cited

U.S. PATENT DOCUMENTS

| 7,716,415 B2 * | 5/2010 | Sharon ........................ 711/103 |
| 2002/0091905 A1 * | 7/2002 | Geiger et al. .................. 711/170 |
| 2005/0210184 A1 | 9/2005 | Chen et al. |

* cited by examiner

*Primary Examiner* — Kevin Ellis
*Assistant Examiner* — Ryan Bertram
(74) *Attorney, Agent, or Firm* — Oblon, Spivak, McClelland, Maier & Neustadt, L.L.P.

(57) ABSTRACT

A memory control method includes writing converted data which is produced by carrying out a code conversion on original data into a memory. An amount of 1s in the converted data is less than an amount of 1s in the original data. Further, the memory control method includes outputting reproduced data which is provided by carrying out an inverse transformation of the code conversion on the converted data which is read out from the memory, to a host system for processing the original data.

15 Claims, 3 Drawing Sheets

US 8,015,370 B2

MEMORY CONTROL METHOD AND MEMORY SYSTEM

BACKGROUND OF THE INVENTION

1. Field of the Invention

The present invention relates to a technique to avoid unintended rewriting of data or reduce the possibility thereof, due to repeated readouts of data from a nonvolatile memory.

2. Description of the Background Art

NAND flash memories, among nonvolatile memories, are heavily used for SD memory cards or the like for the purpose of achieving high integration, reduction in manufacturing cost and easy writing for users by simplifying circuit configurations.

In recent, NAND flash memories are adopted for game machines or the like. When the NAND flash memories are used for game machines, there occurs no write operation but only consecutive read operations. In other words, NAND flash memories have been increasingly adopted as ROMs.

Since specific programs are repeatedly read out in the game machines or the like in most cases, however, it begins to be noticed that the programs could be unintendedly rewritten. Such a phenomenon is termed "read disturb phenomenon", and the mechanism of this phenomenon will be briefly discussed below.

FIG. 3 is a schematic diagram showing an NAND flash memory. The NAND flash memory is constituted of a bit line 51 and word lines 52, 53 and 54 which are arranged in a lattice manner, memory cells 62 and 63, a selection transistor 64 and the like.

In a case where binary data ("0" or "1") stored in the memory cell 62 is read out, the memory cell 62 is a selected cell and the memory cell 63 is an unselected cell. First, the selection transistor 64 specifies the bit line 51 to which the selected cell 62 belongs. Next, a low gate voltage (V(Low) =0V) is applied to the word line 52 to which the selected cell 62 belongs. Then, a high gate voltage (V(High) of approximately 5V) is applied to the word line 53 to which the unselected cell 63 belongs. At that time, since the unselected cell 63 is in a very weak writing condition, electrons are trapped in a floating gate of the unselected cell 63 and accumulated therein. In other words, when binary data stored in the selected cell 62 is repeatedly read out, there is a possibility that a threshold voltage of the unselected cell 63 might be shifted and binary data stored in the unselected cell 63 might be unintendedly rewritten, being changed from "1" to "0".

Even if the binary data stored in the unselected cell 63 is unintendedly rewritten, however, when data are collectively erased before new data are written, it is possible to recover the function of the unselected cell 63. But, if there occurs no write operation and only consecutive read operations, it is impossible to recover the function of the unselected cell 63.

US Patent Application Publication No. 2005/0210184 discloses means for avoiding the above-discussed read disturb phenomenon by controlling the inside of a memory cell. This disclosed method, however, can be applied to a memory having a specific cell configuration but can not be applied to any other cell configuration. In other words, by this method, it is impossible to avoid the read disturb phenomenon without depending on cell configurations of memories.

SUMMARY OF THE INVENTION

The present invention is intended to a memory control method of controlling access to a memory for writing and readout.

A memory control method according to the present invention comprises: a converted data writing step of writing converted data which is produced by carrying out code conversion on original data into the memory; and a reproduced data outputting step of outputting reproduced data which is provided by carrying out inverse transformation of the code conversion on the converted data which is read out from the memory, to a host system for processing the original data.

According to the present invention, not original data including a large amount of binary data which is apt to be unintentionally rewritten, but converted data produced by carrying out on the original data error-tolerant code conversion for reducing an amount of binary data which is apt to be unintentionally rewritten, is written into the memory. As a result, it is possible to avoid or suppress a "read disturb" phenomenon.

According to another aspect of the present invention, the converted data writing step includes a step of selecting a type of a technique for the code conversion in accordance with characteristic of the original data and writing the type of the technique for the code conversion into the memory.

According to the present invention, a type of a technique for the error-tolerant code conversion is selected in accordance with characteristic of the original data. As a result, it is possible to avoid or suppress a "read disturb" phenomenon.

Therefore, it is an object of the present invention to provide a technique for avoiding or suppressing a "read disturb" phenomenon in various types of non-volatile memories without constraints imposed by a cell structure of a memory.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
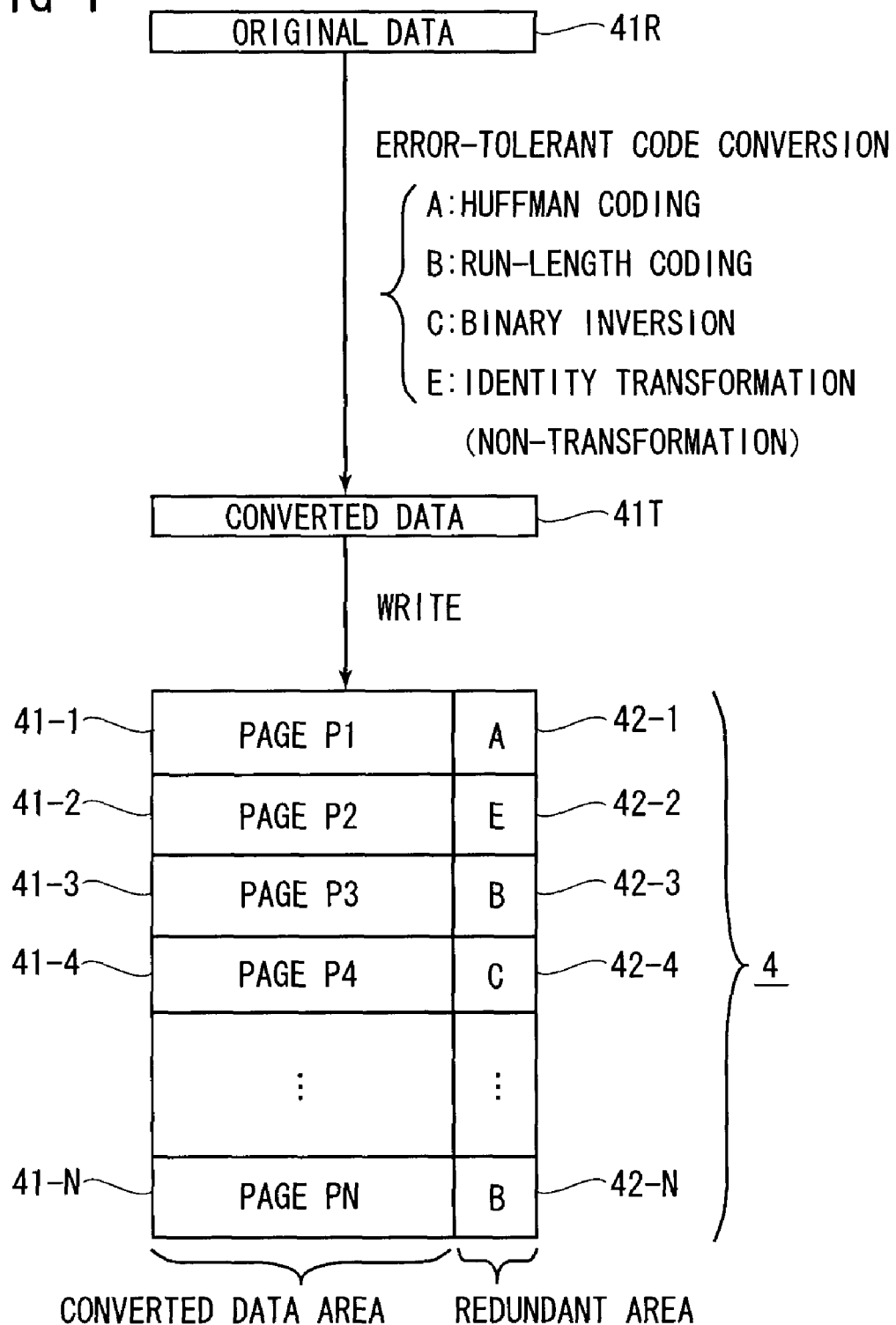
FIG. 1 is a view showing content of data stored in a memory.

Hereinafter, preferred embodiments of the present invention will be discussed with reference to accompanying drawings. FIG. 1 shows content of data stored in a memory. Original data 41R is data produced by a programmer. In usual cases, the original data 41R is written into a memory 4.

However, the original data 41R may possibly be data including a large amount of binary data which is apt to be unintentionally rewritten. More specifically, while a specific data is being repeatedly read out, binary data stored in a memory cell which has become slightly writable is apt to be rewritten to be different binary data, as described above. Thus, it is difficult to avoid or suppress a "read disturb" phenomenon in which data is unintentionally rewritten when the original data 41R is repeatedly read out from the memory 4.

In view of the foregoing matters, according to the preferred embodiments of the present invention, converted data 41T including a smaller amount of binary data which is apt to be unintentionally rewritten is produced from the original data 41R, and the converted data 41T is stored in the memory 4. Accordingly, it is possible to avoid or suppress a "read disturb" phenomenon when the converted data 41T is repeatedly read out from the memory 4. A method of producing the converted data 41T from the original data 41R and a method of storing the converted data 41T into the memory 4 will be discussed at later paragraphs.

Nonetheless, not the converted data 41T but the original data 41R is supposed to be read out from the memory 4 in the preferred embodiments of the present invention, as well as in the usual cases. As such, the original data 41R is again produced from the converted data 41T which is read out from the memory 4. A method of producing the original data 41R from the converted data 41T will be discussed with reference to FIG. 2, as follows.

First, the method of producing the converted data 41T from the original data 41R will be discussed. Error-tolerant code conversion is carried out on the original data 41R, to produce the converted data 41T. According to the preferred embodiments of the present invention, Huffman coding A, run-length coding B, binary inversion C, and identity transformation E are employed as a technique for error-tolerant code conversion. In this regard, identity transformation E may be replaced by non-transformation. Further, the techniques A, B, C, and E for error-tolerant code conversion can be carried on the original data 41R more than once. For example, the same technique for error-tolerant code conversion may be carried out more than once, or different techniques for error-tolerant code conversion may be successively carried out. Moreover, the present invention is applicable to the use of the other techniques for error-tolerant code conversion than cited above.

For producing the converted data 41T from the original data 41R, a suitable technique for error-tolerant code conversion can be selected from the techniques A, B, C, and E for error-tolerant code conversion in accordance with the characteristic of the original data 41R. For example, the techniques A, B, C, and E for error-tolerant code conversion are applied to the original data 41R on a trial basis, so that respective pieces of data as the converted data 41T are produced. Then, one piece of data that includes the smallest amount of binary data which is apt to be unintentionally rewritten is selected from the produced respective pieces of data as the converted data 41T. The technique for error-tolerant code conversion which is used for producing the selected piece of data as the converted data 41T is selected as a suitable technique for error-tolerant code conversion in accordance with the characteristic of the original data 41R.

In the preferred embodiments of the present invention, a NAND flash memory of a single-level cell type (SLC NAND flash memory) is employed as the memory 4. In a case where a SLC NAND flash memory is employed as the memory 4, binary data which is apt to be unintentionally rewritten is data "1". Accordingly, a piece of data as the converted data 41T that includes the smallest amount of data "1" is selected from respective pieces of data as the converted data 41T which are produced by applying the techniques A, B, C, and E for error-tolerant code conversion to the original data 41R on a trial basis, for example. Then, the technique for error-tolerant code conversion which is used for producing the selected piece of data as the converted data 41T is selected as a suitable technique for error-tolerant code conversion in accordance with the characteristic of the original data 41R.

Next, the method of storing the converted data 41T into the memory 4 will be discussed. Not only the converted data 41T, but also a flag indicating a type of a suitable technique for error-tolerant code conversion in accordance with the characteristic of the original data 41R is stored in the memory 4. Also, a flag indicating a type of a suitable technique for error-tolerant code conversion can be set per predetermined unit of the memory 4. According to the preferred embodiments of the present invention, a flag indicating a type of a suitable technique for error-tolerant code conversion is set per page (readout unit) of the memory 4, and stored in a redundant area of each page. However, a flag indicating a type of a suitable technique for error-tolerant code conversion may alternatively be set per block (erase unit) of the memory 4.

For example, consider a situation in which the technique A for error-tolerant code conversion is selected from the techniques A, B, C, and E for error-tolerant code conversion as a suitable technique for error-tolerant code conversion, in accordance with the characteristic of the original data 41R, which is supposed to be stored in a page P1 of the memory 4 under normal conditions. In this situation, the technique A for error-tolerant code conversion is carried out on the original data 41R, to produce the converted data 41T. Then, the produced converted data 41T and a flag indicating "A" as a type of a technique for error-tolerant code conversion are stored in a converted data area 41-1, which area is reserved for storage of converted data, and a redundant area 42-1, respectively. The same processes as performed on the original data 41R which is supposed to be stored in a page P1 of the memory 4 under normal conditions are performed on the original data 41R which is supposed to be stored in each of all pages from a page P2 to a page PN under normal conditions.

Now, some possible methods of writing the converted data 41T into the memory 4 will be discussed as follows. According to a first method, the converted data 41T is produced from the original data 41R and written into the memory 4 at the time of manufacturing the memory 4. According to a second method, the converted data 41T is produced from the original data 41R in a download server and the converted data 41T is downloaded to be written into the memory 4 after an information processor including the memory 4 is marketed. According to a third method, the converted data 41T is produced from the downloaded original data 41R and the converted data 41T is written into the memory 4 after an information processor including the memory 4 is marketed. In a case where the above-noted third method is implemented, the converted data 41T can be produced from the downloaded original data 41R anywhere in the information processor including the memory 4.

Figure 2:
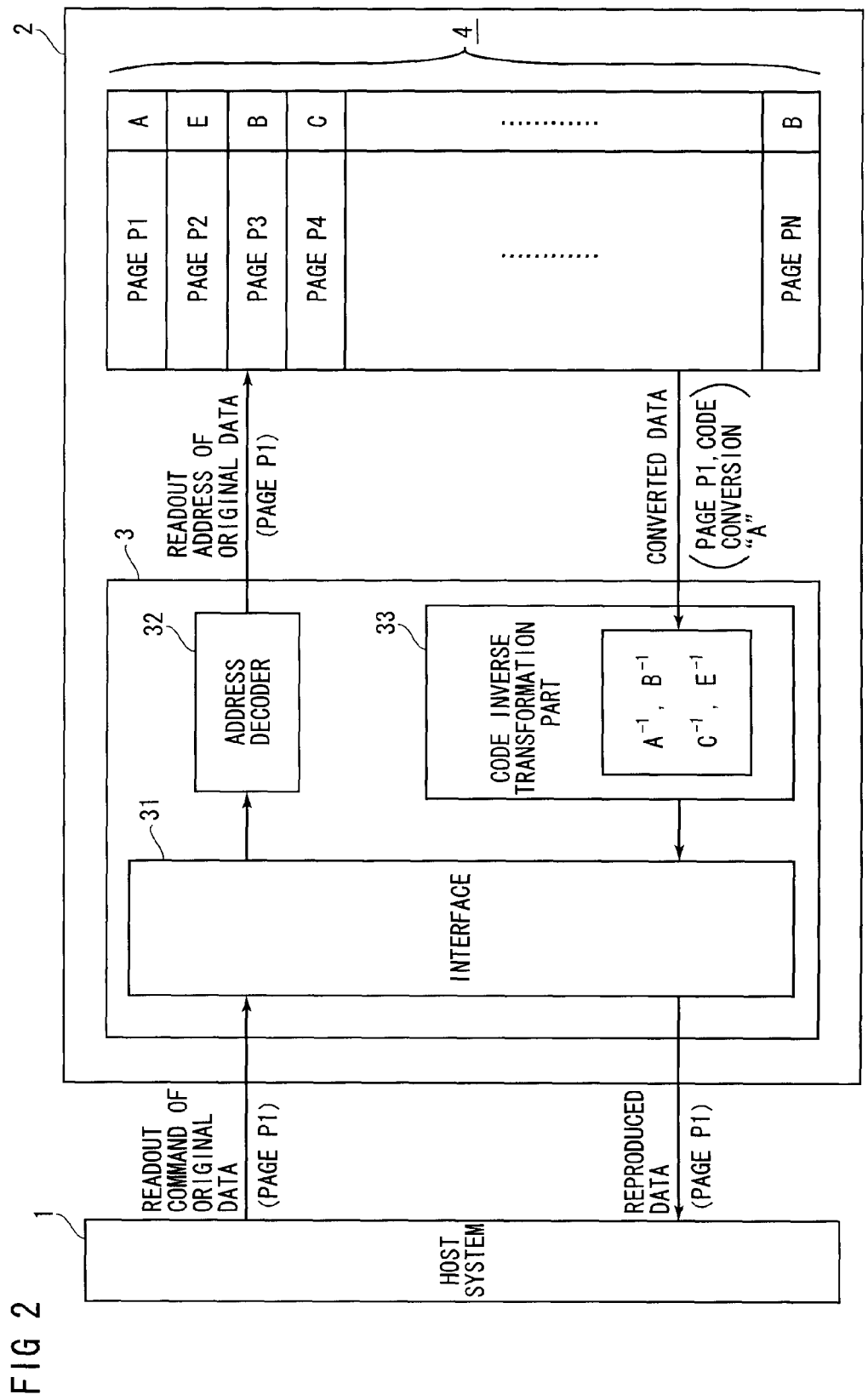
FIG. 2 is a view showing processes for processing original data in a host system.
Figure 3:
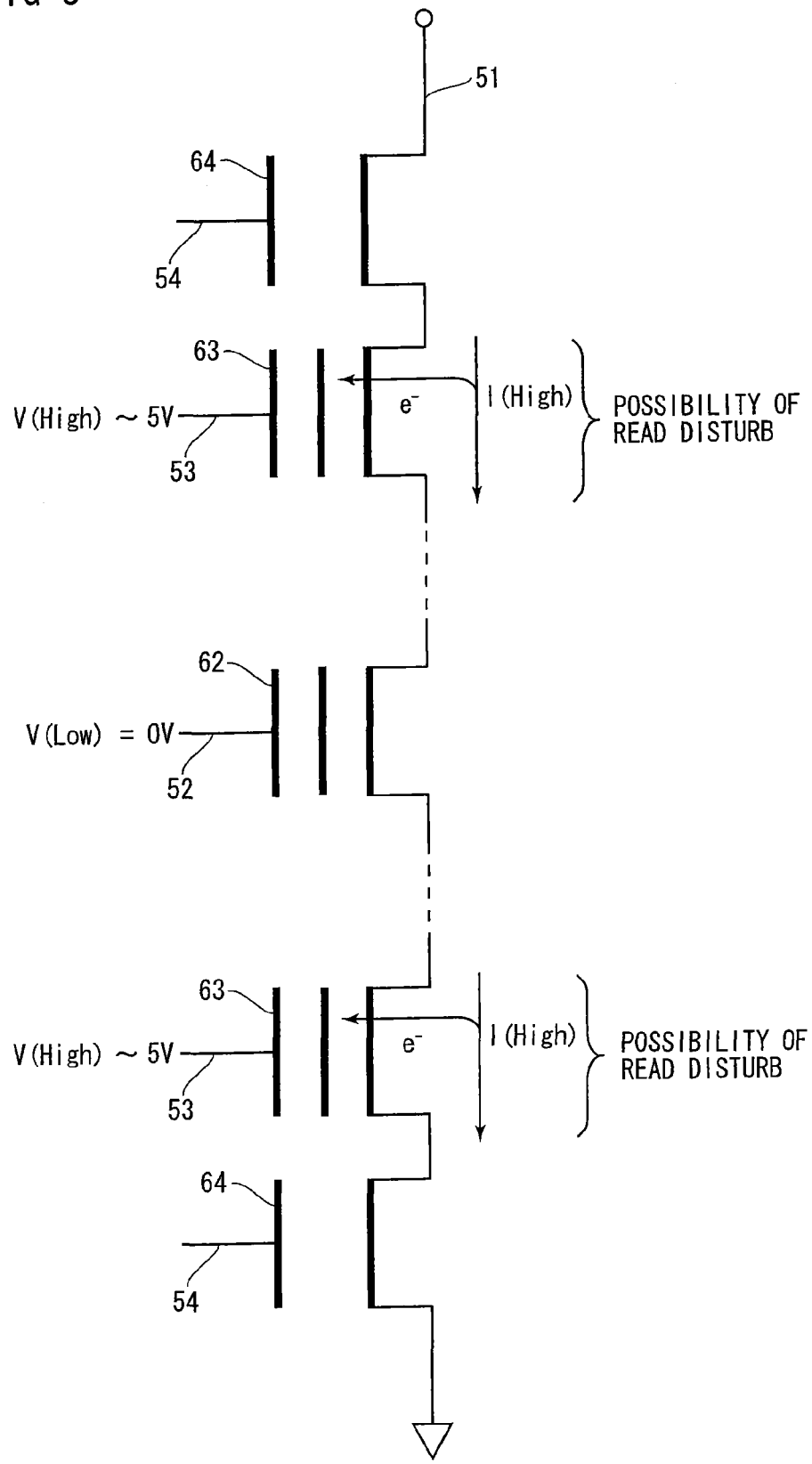
FIG. 3 is a schematic view of a NAND flash memory.

Next, a process flow for processing the original data 41R in a host system will be discussed with reference to FIG. 2. A host system 1 and a memory system 2 are connected with each other via an interface 31 provided within the memory system 2. The host system 1 outputs a command which designates an address of data which is expected to be read out ("readout command") of the original data 41R to the memory system 2. Further, the host system 1 receives reproduced data which will be described in detail at later paragraphs from the memory system 2, and processes the reproduced data. Since the original data 41R and the reproduced data are identical to each other, the host system 1 can process the original data 41R as a result.

The memory system 2 includes a memory controller 3 and the memory 4. The memory controller 3 is operative to control access to the memory 4 so that the host system 1 can process the original data 41R. Details of the memory 4 have been provided at earlier paragraphs with reference to FIG. 1. That is, the memory 4 is operative to store the converted data 41T which is produced by carrying out error-tolerant code conversion on the original data 41R.

The memory controller 3 includes the interface 31, an address decoder 32, a code inverse transformation part 33, and the like.

The interface 31 allows the host system 1 and the memory system 2 to exchange a readout command of the original data 41R and reproduced data therebetween.

The address decoder 32 extracts an address at which data which is to be expected to be read out is stored ("readout address") of the original data 41R from a readout command of the original data 41R which is received from the host system 1, and outputs the extracted readout address to the memory 4.

The code inverse transformation part 33 is operative to carry out inverse transformation of error-tolerant code conversion on the converted data 41T which is received from the memory 4, and to provide reproduced data. Further, the code inverse transformation part 33 outputs the reproduced data to the host system 1. Thus, the reproduced data is provided by carrying out inverse transformation of error-tolerant code conversion after carrying out error-tolerant code conversion on the original data 41R. Accordingly, the original data 41R and the reproduced data are identical to each other.

Below, a process flow for processing the original data 41R in the host system 1 in an information processor including the host system 1 and the memory system 2 will be discussed. The following discussion in the preferred embodiments will deal with a situation in which the host system 1 processes the original data 41R which is supposed to be stored in a page P1 of the memory 4 under normal conditions. However, also in a situation in which the host system 1 processes the original data 41R which is supposed to be stored in each of all pages from a page P2 to a page PN of the memory 4 under normal conditions, the same process flow as that in the situation in which the host system 1 processes the original data 41R which is supposed to be stored in a page P1 of the memory 4 under normal conditions can be performed.

The host system 1 outputs a readout command for reading out the original data 41R to the address decoder 32 via the interface 31. Then, the address decoder 32 extracts a readout address of the original data 41R from the readout command of the original data 41R which is received from the host system 1, and outputs the extracted readout address to the memory 4.

The memory 4 reads out the converted data 41T which is stored in a converted data area 41-1 of the page P1 and a flag indicating "A" as a type of a technique for error-tolerant code conversion which is stored in a redundant area 42-1 of the page P1, based on the readout address of the original data 41R which is received from the address decoder 32. Then, the memory 4 outputs the converted data 41T and the flag indicating "A" as a type of a technique for error-tolerant code conversion to the code inverse transformation part 33.

The code inverse transformation part 33 carries out inverse transformation of the technique A for the error-tolerant code conversion on the converted data 41T which is received from the memory 4, based on the flag indicating "A" as a type of a technique for error-tolerant code conversion which is also received from the memory 4. In this regard, it is noted that in FIG. 2, a numeral "−1" written above and to the right of each of the characters "A", "B", "C", and "E" is used to represent inverse transformation of error-tolerant code conversion. Specifically, the characters "A", "B", "C", and "E" in FIG. 2 each with a numeral "−1" at an upper right corner thereof denote inverse transformations of the techniques "A", "B", "C", and "E", respectively. Further, the code inverse transformation part 33 outputs reproduced data which is provided by carrying out inverse transformation of the technique A for error-tolerant code conversion, to the host system 1 via the interface 31. This results in that the host system 1, which receives the reproduced data, can process the original data 41R.

According to the preferred embodiments of the present invention, the memory controller 3 includes the code inverse transformation part 33. However, provision of reproduced data using the converted data 41T may be achieved anywhere in the information processor including the host system 1 and the memory system 2.

While the host system 1 processes the original data 41R including a large amount of binary data which is apt to be unintentionally rewritten, the memory 4 stores the converted data 41T including a smaller amount of binary data which is apt to be unintentionally rewritten. As such, data which is read out directly from the memory 4 is not the original data 41R, but the converted data 41T. Accordingly, it is possible to avoid or suppress a "read disturb" phenomenon.

Also, in producing the converted data 41T from the original data 41R, the converted data 41T can be produced per predetermined unit of the memory 4, so that a "read disturb" phenomenon can be more closely coped with.

While the invention has been shown and described in detail, the foregoing description is in all aspects illustrative and not restrictive. It is therefore understood that numerous modifications and variations can be devised without departing from the scope of the invention.

What is claimed is:

1. A memory control method of controlling an access to a memory for a writing and a readout, the memory control method comprising:
    carrying out a plurality of techniques for code conversion on original data;
    selecting one of the plurality of techniques for said code conversion to produce converted data, based on an amount of 1s in said converted data;
    writing said converted data into said memory; and
    outputting reproduced data which is provided by carrying out an inverse transformation of said code conversion on said converted data which is read out from said memory, to a host system for processing said original data.

2. The memory control method according to claim 1, wherein said writing includes writing a flag indicating said technique for said code conversion into said memory.

3. The memory control method according to claim 2, wherein said inverse transformation is based on said flag indicating said technique for said code conversion which is read out from said memory.

4. The memory control method according to claim 1, wherein said writing and said outputting are performed per predetermined unit of said memory.

5. The memory control method according to claim 1, wherein said code conversion includes a Huffman coding.

6. The memory control method according to claim 1, wherein said code conversion includes a run-length coding.

7. The memory control method according to claim 1, wherein said code conversion includes a binary inversion.

8. The memory control method according to claim 1, wherein said code conversion includes an identity transformation.

9. A memory system, comprising:
    a memory; and
    a memory controller for controlling an access to said memory, wherein
    said memory stores converted data which is produced by carrying out a plurality of techniques for code conversion on original data which is processed by a host system and selecting one of the plurality of techniques for said code conversion based on an amount of 1s in the converted data, and said memory controller includes a code inverse transformation part that carries out an inverse transformation of said code conversion on said converted data which is read out from said memory, and thereafter outputs reproduced data which is provided as a result of said inverse transformation of said code conversion, to said host system.

10. The memory control method according to claim 1, wherein, among the plurality of techniques, the one of the plurality of techniques produces a least amount of 1s from said original data.

11. The memory control method according to claim 1, wherein said memory is a NAND flash memory.

12. The memory control method according to claim 11, wherein said NAND flash memory is of a single-level cell type.

13. A memory control method, comprising:
carrying out a plurality of techniques for a code conversion on original data; and
selecting one of the plurality of techniques to produce converted data to be written into a memory, based on an amount of 1s in said converted data.

14. The memory control method according to claim 13, wherein said converted data is written into the memory at a time of a manufacturing of the memory.

15. The memory control method according to claim 13, wherein said converted data is produced in a download server and is downloaded to be written into the memory.

* * * * *